(12) United States Patent
Czagas et al.

(10) Patent No.: US 6,362,075 B1
(45) Date of Patent: Mar. 26, 2002

(54) METHOD FOR MAKING A DIFFUSED BACK-SIDE LAYER ON A BONDED-WAFER WITH A THICK BOND OXIDE

(75) Inventors: Joseph A. Czagas, Palm Bay; Dustin A. Woodbury, Indian Harbour Beach; James D. Beasom, Melbourne Village, all of FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/345,261

(22) Filed: Jun. 30, 1999

(51) Int. Cl.[7] .................. H01L 21/00; H01L 21/30; H01L 21/46
(52) U.S. Cl. .............. 438/455; 438/456; 438/408; 438/164; 438/933
(58) Field of Search .................. 438/455, 456, 438/406, 404, 430, 407, 203, 422, 164, 542, 458, 476, 408, 403, 933

(56) References Cited

U.S. PATENT DOCUMENTS

| | | | |
|---|---|---|---|
| 4,127,932 A | * 12/1978 | Hartman et al. | 438/58 |
| 4,504,334 A | * 3/1985 | Schaake et al. | 438/476 |
| 4,554,059 A | * 11/1985 | Short et al. | 438/408 |
| 4,807,012 A | 2/1989 | Beasom | |
| 4,897,362 A | * 1/1990 | Delgado et al. | 438/406 |
| 4,923,820 A | 5/1990 | Beasom | |
| 5,801,084 A | * 9/1998 | Beasom et al. | 438/457 |
| 5,882,990 A | * 3/1999 | DeBusk et al. | 438/476 |
| 6,057,212 A | * 5/2000 | Chan et al. | 438/455 |
| 6,118,181 A | * 9/2000 | Merchant et al. | 257/757 |
| 6,140,210 A | * 10/2000 | Aga et al. | 438/458 |
| 6,146,979 A | * 11/2000 | Henley et al. | 438/458 |
| 6,159,824 A | * 12/2000 | Henley et al. | 438/455 |
| 6,191,006 B1 | * 2/2001 | Mori | 438/455 |
| 6,211,041 B1 | * 4/2001 | Ogura | 438/458 |
| 6,214,701 B1 | * 4/2001 | Matsushita et al. | 438/458 |

OTHER PUBLICATIONS

Joseph A. Czagas, et al. "Method for Making a Diffused Back–Side Layer on a Bonded–Wafer with a Thick Bond Oxide", pp 1–13, Mar. 2, 1999.

* cited by examiner

*Primary Examiner*—Matthew Smith
*Assistant Examiner*—Chuong A Luu
(74) *Attorney, Agent, or Firm*—Fogg, Slifer & Polglaze, P.A.; Scott V. Lundberg

(57) ABSTRACT

Integrated circuits, semiconductor devices and methods for making the same are described. Each embodiment shows a diffused, doped backside layer in a device wafer that is oxide bonded to a handle wafer. The diffused layer may originate in the device wafer, in the handle wafer, in the bond oxide or in an additional semiconductor layer of polysilicon or epitaxial silicon. The methods use a thermal bond oxide or a combination of a thermal and a deposited oxide.

26 Claims, 4 Drawing Sheets

METHOD FOR MAKING A DIFFUSED BACK-SIDE LAYER ON A BONDED-WAFER WITH A THICK BOND OXIDE

BACKGROUND OF THE INVENTION

The High-Voltage Switch (HVS) process technology is designed to fabricate a high-voltage relay circuit, and a high-voltage switch circuit. Both of these types of circuits are used in telecom. (wired telephone) products/applications. One of the primary devices fabricated in the HVS technology is a NDMOS with a 400 V breakdown.

One of the features of the 400 V NDMOS is that it requires a p-type layer in the bottom of the lightly-doped p-type device island in which it is formed. The p-type layer in the bottom of the p-type island is used to provide enough charge to fully deplete the drain extension layer. The use of a p-type bottom layer to control the depletion of a p-type island due to substrate bias is described by Beasom, U.S. Pat. Nos. 4,923,820 and 4,807,012. This also applies to the general case of depleting a drain extension, or junction termination extension (JTE) layer in a relatively thin, lightly doped island. FIG. 1a shows a conventional drain. FIG. 1b shows a drain with drain extensions. Note the differences in size and shape between the depletion zone of FIG. 1a and the depletion zone of FIG. 1b. The drain/junction-termination extension is used to improve (raise) the breakdown voltage of the device by de-focusing the field formed at the edge of the pn junction in the drain region.

Another purpose for the use of the backside highly-doped p-type layer in the HVS process technology, is to provide shielding at the bottom of the device island to protect the devices from swings in the potential of the handle wafer under the bond oxide (which can vary in sign, and may be in the magnitude of hundreds of volts), when devices made in this technology are used in switching applications. Basically, these voltage swings can cause the device island to deplete from the backside. Increasing the doping at the bottom of the device island helps to terminate any depletion field coming from the handle wafer on the backside of the device island. This allows for the device island to then deplete the drain extensions fully.

A p-type layer may be formed in the bottom of a lightly-doped p-type device island by doping the bottom of the device wafer before it is bonded to the handle wafer. See FIGS. 2a–2d. A disadvantage of this process is that the bottom p-type layer 12 will up-diffuse into the lightly doped p-type device wafer 10 during the growth of the bottom isolation (bond) oxide 14, and during the bonding process where the device and handle wafer are joined. These processes may have a large Dt (Diffusivity-time product) resulting in a thickening of the bottom p-type layer when boron is used as the p-type dopant 12.

Generally, in order to make high-voltage devices, junction depths must be scaled (made deeper) than for an equivalent device in a low-voltage process. Increasing junction depth, entails increasing Dt used in fabricating the devices. This also causes up-diffusion of a bottom p-type layer into the bulk of the lightly-doped p-type device island. The HVS process originally used a p-type (50 to 150 $\Omega$-cm) device island of about 35 to 40 $\mu$m thickness. Into this, a p-type layer was implanted/diffused into the backside of the device wafer before the bond oxide is grown, after which the device wafer is bonded to the handle wafer.

In HVS, the backside p-type layer is put in before the wafer sees any of the Dt of the process. The first HVS fill-process material was found (by SRP) to have the backside p-type layer that was not confined to within a few microns ($\mu$m) of the bottom of the device island (adjacent to the bond oxide), but that had up-diffused to nearly the surface of the lightly-doped p-type device island. This reduces the effectiveness of the backside p-type layer in enhancing the breakdown of the high-voltage devices.

The device island doping at the bottom needs to be restricted as closely as possible to the bottom of the device island (the device-Si/bond-oxide interface), so that high fields near breakdown are integrated over the greatest possible distance, and thus allow the maximum possible breakdown voltage. This leads to a penalty incurred for any thermal treatment (Dt) done after the backside p-type layer has been introduced. This is analogous to the unwanted up-diffusion of a buried layer. However, it should also be noted that the method and structure of this disclosure may be applied to current-carrying buried layers as well. The nature of bonded-wafer processing entails significant thermal treatment: device oxidation on the island bottom, bond oxidation during mating of the device/handle wafers, and trench sidewall oxidation to provide lateral device isolation. The thermal processing required for the front-side diffused layers further compounds the problem.

There are some obvious ways of mitigating the loss of breakdown due to up-diffusion of the backside p-type layer into the lightly-doped p-type device island Si. One is to lower the dose of the backside p-type (boron) implant. This does not correct the problem with up-diffusion, it just limits the concentration of dopant that is available for up-diffusion. Another way of keeping the backside p-type layer towards the bottom of the device island, is to increase the thickness of the device island. This is problematic for a couple of reasons. The trench etch must go through the entire thickness of the device island SL to provide lateral isolation for devices. Etching the isolation trench through a thicker device island, will result in more chance of small dimension device island geometries being undercut and delaminating from the handle wafer during subsequent processing. This results in an increase in the minimum device island size, and trench-to-trench minimum space, both of which result in a die area increase. The increase in trench depth also results in an decrease in equipment throughput at the trench etch operation.

SUMMARY

The invention provides silicon on insulator devices with diffused device wafer backside layers and methods for manufacturing the same. Integrated circuits and semiconductor devices are formed in device islands in a device wafer. The device wafer is held to a handle wafer by a bond oxide. The diffused doped layer is on the backside of the device wafer between the device islands and the bond oxide. The dopants in the diffused layer may be initially implanted into either the device wafer or handle wafer. Implantation is made directly into the semiconductor material or through an oxide layer. The dopant may be diffused from a deposited or grown semiconductor layer that is itself implanted or otherwise doped with a diffusing dopant. When boron is the diffusing dopant, boron ions may be implanted into a bond oxide layer and then diffused from the bond oxide into the device wafer.

DETAILED DESCRIPTION OF THE INVENTION

The invention is used in fabricating a DMOS device that is built in a lightly doped P type island using a lateral drain extension structure as described in U.S. Pat. Nos. 4,823,173 and 5,264,719. The island is oxide isolated by the bonded wafer structure.

Lateral drain extensions and similarly functioning junction termination extension (JTE) layers are used to improve (increase) breakdown voltage by defocusing the electric field formed at the edge of a high voltage PN junction (the drain body junction in the DMOS). The proper operation of such extension regions requires that they totally deplete in a controlled way. Controlled depletion requires that the integrated island doping (doping ions per $cm^2$) beneath the extension be greater than the integrated doping in the extension. This requirement is not met in thin islands of uniform light doping. The problem can be overcome by adding a region of increased doping in the bottom of the island which increases the integrated doping above the critical level.

In some applications, the DMOS devices will be operated at bias voltages which can range hundreds of volts above and below the voltage on the handle wafer on which the device island is formed. Such bias can deplete a portion of the island from the bottom reducing the integrated charge available to deplete the extension layer. This effect can also be controlled by adding a layer of increased doping to the bottom of the island which has the same conductivity type as the island. This structure and method are described in U.S. Pat. Nos. 4,923,820 and 4,807,012.

When an oxide isolated device having a lateral drain extension or JTE layer is made in a thin lightly doped island and must operate at large island terminal voltages with respect to the handle wafer (substrate) voltage, the integrated island doping must be adjusted to accommodate both effects. This requires a higher integrated doping than is required to support just one of these conditions.

Figure 1A:
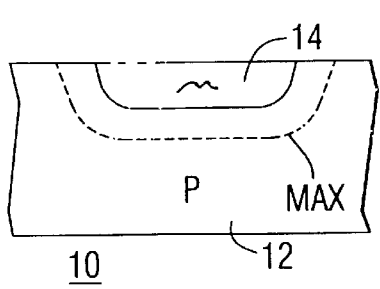
FIGS. 1a and 1b are partial cross sectional views of an n-type well (1a) and an n-type well with a drain extension (1b).
Figure 1B:
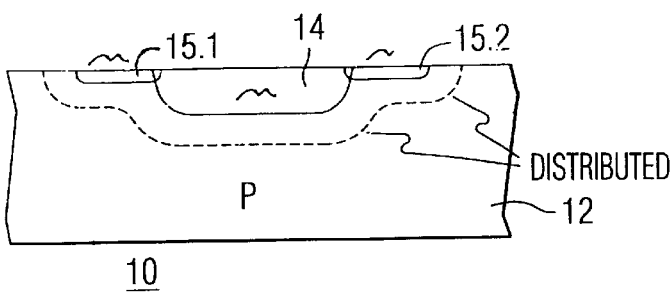
Figure 2A:
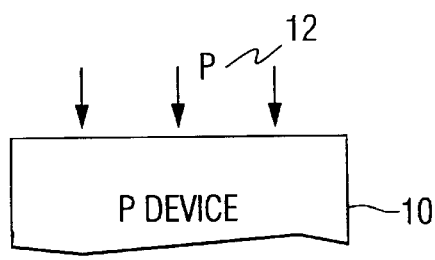
FIGS. 2a–2d show sequential steps in the formation of a prior art diffused backside layer.
Figure 2B:
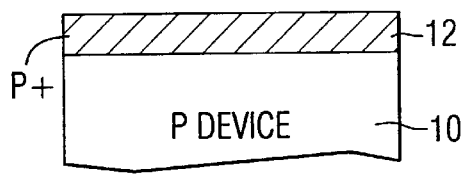
Figure 3A:
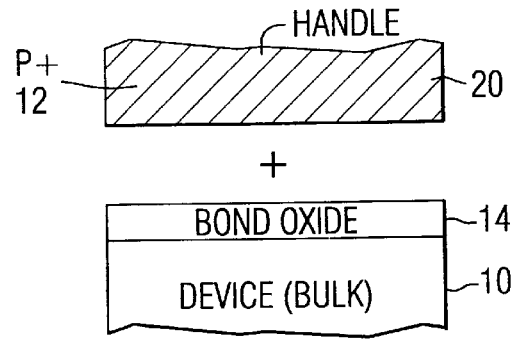
FIGS. 3a–3b show sequential steps in the formation of the first embodiment of the invention, with a p-Type (Boron) implant into the handle wafer.
Figure 2C:
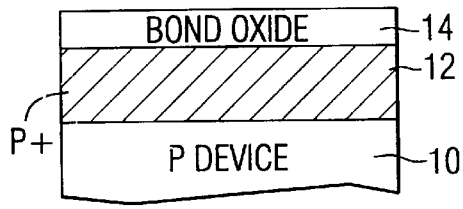
Figure 3B:
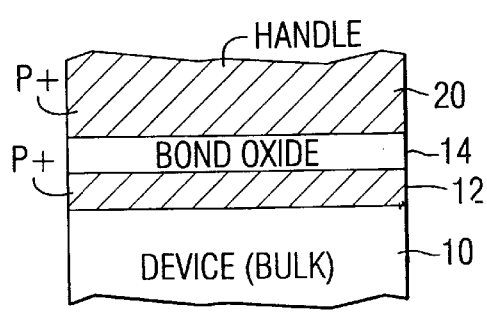
Figure 2D:
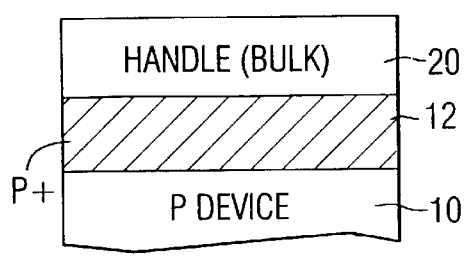

Embodiment 1: Diffusion of a p-Type Dopant (Boron) from the Handle Wafer Through the Bond Oxide The steps shown in FIGS. 3a–3b illustrate a process which provides a thinner p-type backside layer and exploits diffusion of boron through an oxide. A handle wafer 20 that is doped to be p-type, or has a p-type layer at the surface (adjacent to the bond oxide interface), may be used as the dopant source. During the wafer bond operation, and the subsequent high-temperature cycles, the p-type (boron) dopant is diffused through the bond oxide 14, and into the bottom of the device wafer 10, to form the desired p-type bottom layer 12. This p-type layer 12 will be shallower than the p-type layer formed directly in the bottom of the device wafer 10 (FIG. 2), because it must diffuse through the bond oxide 14 before it enters the backside of the device wafer 10.

The concentration of the p-type (boron) dopant introduced into the bottom of the device wafer 10 may be adjusted by choosing, or adjusting the bottom isolation (bond) oxide thickness, p-type (boron) dopant concentration (doping level, and integrated dose/depth, if not done from the bulk of a uniformly-doped handle wafer), and the Dt to which the composite structure (shown in the last part of FIG. 3 on page 4) is subjected.

In addition, the bond oxide 14 may be grown (either partially, or fully) on the p-type handle wafer 20, so as to incorporate the p-type (boron) dopant into this oxide as it is grown. This will result in less Dt required to drive the p-type (boron) dopant into the bottom of the device wafer. For example: A boron implant of $1.1 \times 10^{13}$ atoms/$cm^2$ was done into a boron-doped $3 \times 10^{14}$ atoms/$cm^2$ p-type wafer. This wafer had 2 $\mu$m of oxide grown on it, and was bonded to a $3 \times 10^{14}$ atoms/$cm^2$ n-type wafer. A p-type (boron) layer of approximately $3.6 \times 10^{10}$ atoms/$cm^2$ was formed in the n-type wafer after the wafer bond operation.

Figure 4A:
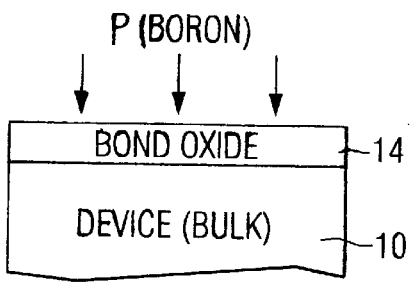
FIGS. 4a–4c show sequential steps in the formation of the second embodiment of the invention, with a p-Type (Boron) implant directly into the bond oxide.
Figure 4B:
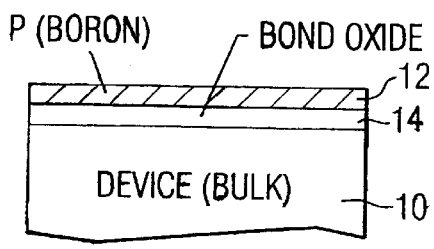
Figure 4C:
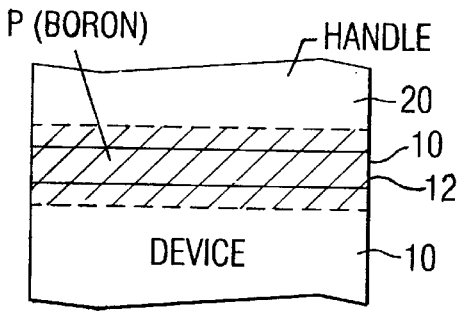
Figure 5A:
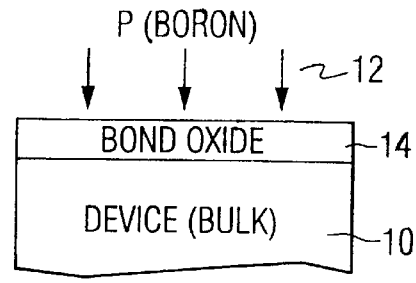
FIGS. 5a–5e show sequential steps in the formation of the third embodiment of the invention, with the use of a composite (thermal/deposited) bond oxide.
Figure 5B:
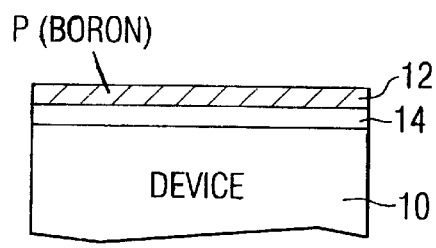
Figure 5C:
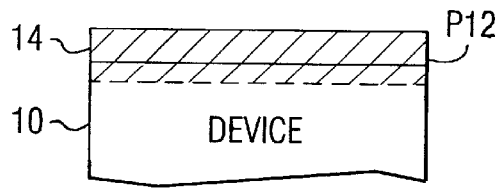
Figure 5D:
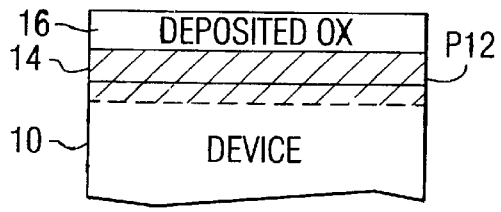
Figure 5E:
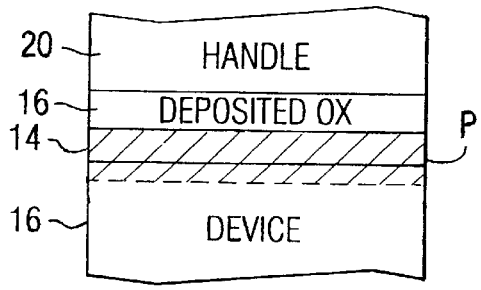
Figure 6A:
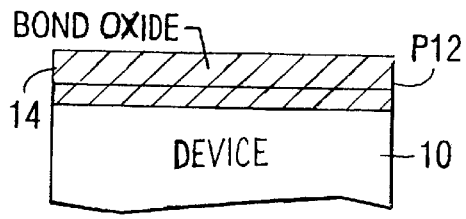
FIGS. 6a–6d show sequential steps in the formation of the fourth embodiment of the invention, growing a composite bond oxide by using a thermal oxidation of a polysilicon layer.
Figure 7A:
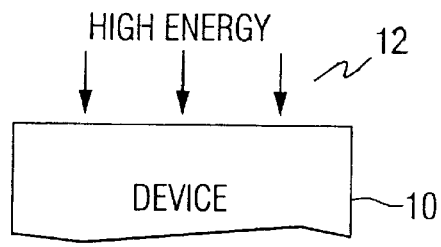
FIGS. 7a–7d show sequential steps in the formation of the fifth embodiment of the invention, using a high-energy implant to place the peak of the backside layer implant into the device wafer.
Figure 6B:
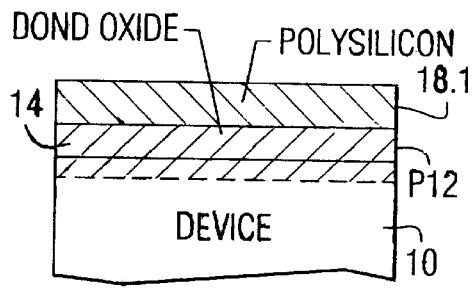
Figure 7B:
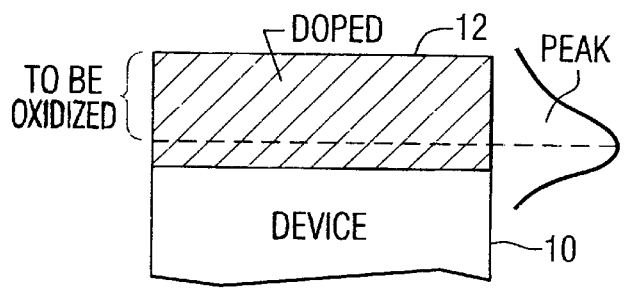
Figure 6C:
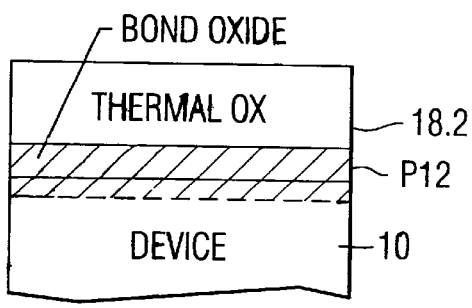
Figure 7C:
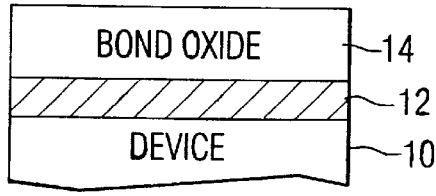
Figure 6D:
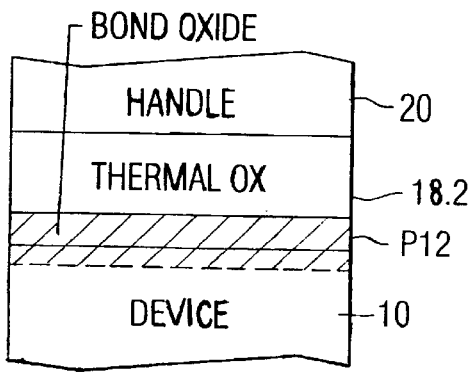
Figure 7D:
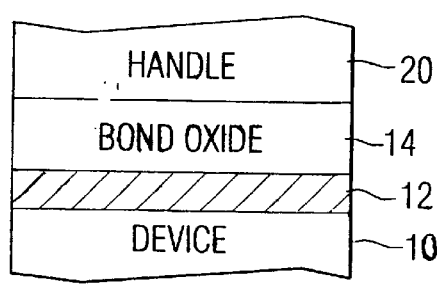
Figure 8A:
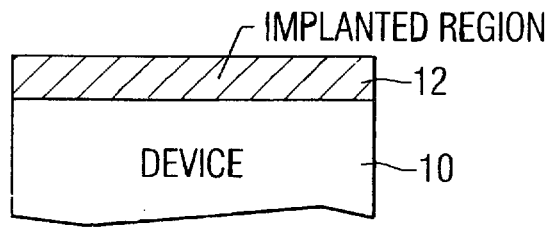
FIGS. 8a–8d show sequential steps in the formation of the sixth embodiment of the invention, using an epitaxial silicon deposition to set the depth of the backside layer implant in the device wafer.
Figure 8B:
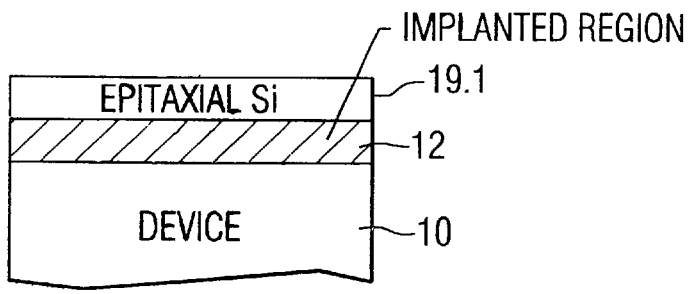
Figure 8C:
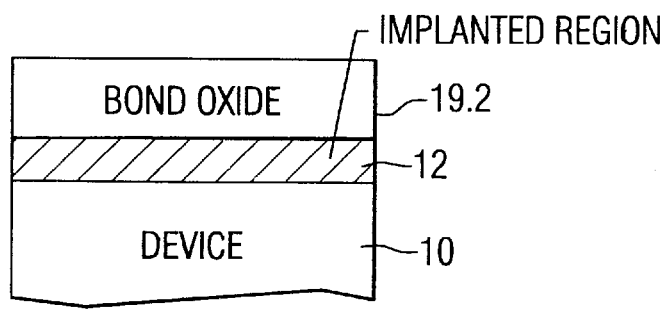
Figure 8D:
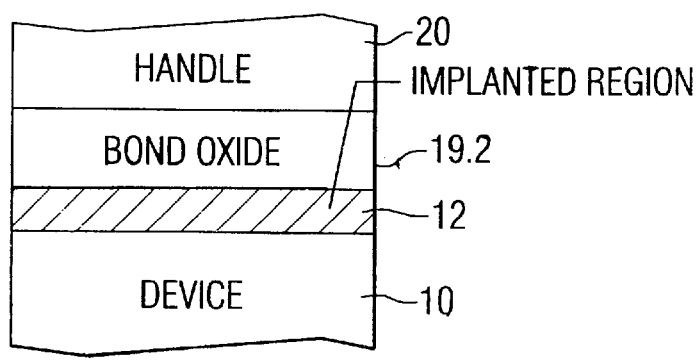

Embodiment 2: p-Type (Boron) Implant Directly Into the Bond Oxide as the P-Type Dopant Source FIGS. 4a–4c show another method of getting a backside p-type layer which is kept as near the bottom of the device island as possible. The method first grows bond oxide 14, implants a p-type (boron) ion into the bond oxide 14, followed by a non-oxidizing diffusion of the boron through the oxide into the bottom of the device wafer 10. The device wafer 10 may then be bonded to the handle wafer 20. Doing the implant of the p-type dopant into the bond oxide 14 has the same benefit as in Embodiment 1, namely using the oxide to delay the introduction of the p-type dopant into the bottom of the device wafer. (It should be noted that the entire p-type implant need not reside solely in the oxide layer, but may also partially breach the device-wafer/bond oxide interface.) (It should be further noted that the step of diffusing can be performed during oxide bonding.)

Embodiment 3: Use of a Composite (Thermal/Deposited) Bond Oxide to Achieve a Shallow Backside p-Type Layer with a Thick Bond Oxide See FIGS. 5a–5e. Embodiments 1 and 2 require that the bond oxide 14 thickness be selected such that the p-type (boron) dopant may be diffused through it, and into the backside of the device wafer 10 in a controlled manner. For bond oxide 14 thicknesses greater than 1 $\mu$m, it has been shown experimentally that the boron does not move significantly from the original as-implanted depth in the oxide, even after significant Dt (1,275° C. for 20 hrs in $N_2$). It is known that when boron is implanted directly into an oxide layer, damage sites are formed, which have an affinity for boron, and thus limit diffusion of boron through the oxide. This may be mitigated by using hydrogen in the diffusion ambient. The hydrogen is said to "passivate" the damage sites, and therefore allow the boron to diffuse more freely through the oxide layer. Fluorine may also be used as a diffusion enhancer in the diffusion of a boron layer implanted into an oxide. The fluoride ion (F−) is very mobile in oxide, and tunnels through the oxide breaking bonds in the process, which creates a path for the boron to follow. Of course, the resulting oxide will be of poor quality, and will require re-densification once the fluorine diffusion ambient is removed.

In the HVS technology, a 2.0 µm bond oxide 14 is required for the fabrication of the solid-state switch circuit. The requirement for the thick bond oxide 14 is due to the high-voltage requirement (around 500 V) of some of the devices used in this circuit. As stated earlier, diffusing a boron layer using either methods of Embodiment 1, or Embodiment 2, through a 2.0 µm bond oxide 14 is not feasible, without using an enhancer (such as hydrogen, or fluorine) in the diffusion ambient. Implanting the boron into an oxide layer less than 1.0 µm thick, and doing a non-oxidizing drive, followed by an oxidation to grow the additional thickness of bond oxide 14 required, is not feasible. This is because the boron which is diffused into the bottom of the device wafer, will tend to segregate out into the oxide, and the oxidation will consume the backside p-type diffusion layer.

One method for controlling a backside p-type (boron) implant while providing a 2.0 µm bond oxide 14, is to drive the boron implant through a thin (less than 1.0 µm) bond oxide 14 into the backside of the device wafer, and add the remaining required bond oxide 14 thickness by doing a plasma enhanced chemical vapor deposition (PECVD) 16. Conversely, the boron implant could be driven through the thin (less than 1.0 µm) thermal bond oxide layer, after the deposited oxide 16 is added. This would serve to not only set the profile of the backside p-type (boron) layer in the device wafer, but would also serve to density/anneal the deposited oxide portion of the composite bond oxide.

In the past, it was believed that oxides deposited by PECVD processes would be unsuitable for use as a bond oxide, and that a thermally grown oxide was the only suitable choice. It was conjectured that the quality (uniformity; and particulates), bonding, and surface states in these types of deposited oxides was such that a good bond could not be formed at the bond-oxide/handle-wafer interface, and that this would result in device islands delaminating from the substrate during subsequent processing. We have since experimentally determined that this is not the case with currently available tools and practices in the industry. Wafers have been successfully bonded using a composite (thermal/deposited) bond oxide, and have been successfully processed through the remainder of the HVS process flow, without device island delamination.

Embodiment 4: Growing a Composite Bond Oxide by Using a Thermal Oxidation of a Polysilicon Layer FIGS. 6a–6d show another way of getting a shallow backside p-type (boron) layer, while providing for a 2.0 µm bond oxide 14. The method includes depositing a polysilicon layer 18.1 over the first layer of thin bond oxide 14, and oxidizing this to create the additional bond oxide thickness (18.2 and 14) required to make the aggregate 2.0 µm thick oxide. Polysilicon forms a thermal oxide 18.2 (when completely converted to oxide) of twice the original deposited polysilicon thickness. Although the quality of a thermal oxide generated from the oxidation of polysilicon is not as good as that generated from the oxidation of single-crystal silicon, the particulates, bonding, and surface states should be superior to those in a PECVD deposited oxide. The oxidation of the polysilicon could also be incorporated as part of the drive used to get the p-type (boron) layer into the backside of the device wafer.

Also, the doped polysilicon 18.1 could be a dopant source for forming the p-type backside layer. For example, doing a non-oxidizing diffusion using the polysilicon as the dopant source, through the thin bond oxide 14, followed by an oxidation of the polysilicon to form the remaining bond oxide required. This also applies to an originally undoped polysilicon (as-deposited), which has subsequently been doped by doing an implant/diffusion operation.

Embodiment 5: Using a High-Energy Implant to Place the Peak of the Backside Layer Implant Into the Device Wafer A high-energy implant may be used to place a backside dopant at sufficient depth (peak concentration of the implanted dopant) such that it is deeper than the portion of device wafer 10 silicon consumed in growing the bond oxide 14. Such a method is shown in FIGS. 7a–7d. This method does not eliminate concerns about up-diffusion of the dopant into the device wafer, but it does allow for better control of the process to minimize this.

A variation of Embodiment 4 is shown in FIGS. 8a–8d. There a low-energy implant introduces a backside dopant into the surface of a device wafer 10. An epitaxial silicon layer 19.1 is deposited over this implant. (The epitaxial silicon deposition would be set to half the thickness of the desired bond oxide.) This epitaxial silicon 19.1 could then be oxidized such that it becomes the bond oxide 19.2, and the backside layer 12 remains in the bottom of the device wafer 10. Again, this does not eliminate concerns about up-diffusion of the dopant into the device wafer, but it does allow for better control of the process to minimize this.

Embodiment 7: Use of Multiple Backside Layers to Separately Assist in Drain/Junction-Termination Extension Depletion, and to Control Fields from the Handle Wafer In the Background the rationale for using backside layers was discussed. There were two (2) reasons for using a backside diffused layer. The first was to provide additional charge at the bottom of the device island to allow drain/junction-termination extensions to deplete fully, thus enhancing (increasing) breakdown voltage of the device. The second was to provide a shielding layer at the bottom of the device island, to protect the active device from fields arising from varying voltages in the handle wafer 20 under the bond oxide. One, or more of the above embodiments may be used to allow for the manufacture of multiple backside layers to separately control each of these issues affecting device performance. In this particular case, a shallow heavily-doped p-type layer may be used to control fields from the handle wafer 20. A deeper more lightly-doped p-type layer may be used to assist in depletion of the drain/junction-termination extensions. Note however, that multiple application of these embodiments is not restricted to these applications, or to just to two (2) backside layers.

The invention is not limited to the detailed embodiments shown above. It is intended to include those embodiments as well as further modifications, changes, improvements and additions that are in the spirit and scope of the appended claims.

We claim:

1. A method for forming a diffused, doped backside layer in a device wafer that is oxide bonded to a handle wafer comprising the steps of:

forming a bond oxide on one surface of one of the wafers;

forming a diffusing layer over the bond oxide, said bond oxide situated between said diffusing layer and said device wafer;

diffusing dopants from the diffusing layer through the bond oxide into the backside surface of the device wafer to provide a diffused, doped backside layer in the device wafer;

forming device islands in the opposite surface of the device wafer and above the diffused, doped layer on the backside thereof.

2. The method of claim 1 wherein the diffused, doped backside layer is formed by implanting an oxide layer with dopant and diffusing the implanted ions into the backside surface of the device wafer.

3. The method of claim 1 wherein the bond oxide is formed by thermal oxidation and a layer of oxide is deposited on the bond oxide.

4. The method of claim 1 wherein the diffused, doped backside layer is formed by implanting the handle wafer and diffusing the dopant through the bond oxide into the device wafer.

5. The method of claim 1 wherein the diffused, doped backside layer is formed by implanting the backside surface of the device layer, depositing a semiconductor layer on the implanted surface and oxidizing the deposited layer to form a bond oxide.

6. The method of claim 1 wherein the diffused, doped backside layer is formed by implanting the backside surface of the device layer, epitaxially growing a semiconductor layer on the implanted surface and oxidizing the epitaxial layer to form a bond oxide.

7. The method of claim 1 wherein the diffused, doped backside layer is formed by implanting the backside surface of the device layer and oxidizing the backside surface of the device wafer to form a bond oxide.

8. A method for forming a diffused, doped backside layer on a device wafer oxide bonded to a handle wafer comprising the steps of:

forming a dopant layer of a diffusing dopant in a surface of a handle wafer;

oxide bonding the doped surface of the handle wafer to a backside surface of a device wafer;

diffusing dopant from the surface of the handle wafer through the bond oxide to the backside surface of the device wafer.

9. The method of claim 8 wherein the dopant comprises boron.

10. The method of claim 8 wherein the bond oxide is partially grown on the handle wafer.

11. The method of claim 8 wherein the bond oxide is fully grown on the handle wafer.

12. A method for forming a diffused, doped backside layer on a device wafer oxide bonded to a handle wafer comprising the steps of:

forming a thermal bond oxide layer on a backside surface of a device wafer;

implanting the bond oxide with a diffusing dopant;

diffusing dopant from the bond oxide into the backside surface of the device wafer;

depositing an oxide layer on the bond oxide;

bonding the deposited oxide layer to a handle wafer.

13. The method of claim 12 wherein the dopant comprises boron.

14. The method of claim 12 wherein the deposited oxide is deposited by plasma enhanced chemical vapor deposition.

15. The method of claim 12 further comprising the step of forming a silicon layer on the bond oxide and oxidizing the silicon layer to increase the thickness of the bond layer.

16. The method of claim 12 wherein the implanted dopants partially extend into the backside surface of the device wafer.

17. The method of claim 12 in which the implant is made into the bond oxide before the deposited oxide is formed on the bond oxide.

18. A method for forming a diffused, doped backside layer on a device wafer oxide bonded to a handle wafer comprising the steps of:

forming an oxide layer on the backside surface of a device wafer;

implanting a diffusing dopant into the oxide formed on the backside of the device wafer;

forming an oxide layer on the surface of a handle wafer;

bonding the oxide coated side of the device wafer to the oxide coated side of the handle wafer;

diffusing dopant from the oxide into the backside of the device wafer.

19. The method of claim 18 wherein the dopant comprises boron.

20. The method of claim 18 wherein the deposited oxide is formed on the backside of the device wafer by thermal oxidation.

21. The method of claim 18 further comprising the step of forming a silicon layer on the bond oxide and oxidizing the silicon layer to increase the thickness of the bond layer. (FIG. 6).

22. A method for forming a diffused, doped backside layer on a device wafer oxide bonded to a handle wafer comprising the steps of:

forming a thermal bond oxide layer on a backside surface of a device wafer;

implanting the bond oxide with a diffusing dopant;

diffusing dopant from the bond oxide into the backside surface of the device wafer;

depositing a silicon layer on the bond oxide;

oxidizing the silicon layer to increase the thickness of the bond layer;

bonding the device wafer to the handle wafer.

23. The method of claim 22 wherein the dopant comprises boron.

24. The method of claim 22 wherein the bond oxide is grown on the device wafer.

25. The method of claim 22 wherein the silicon layer is deposited by chemical vapor deposition.

26. The method of claim 22 in which at least some of the diffusion occurs after the device wafer is bonded to the handle wafer.

* * * * *